(12) United States Patent
Jabir et al.

(10) Patent No.: US 10,860,291 B2
(45) Date of Patent: Dec. 8, 2020

(54) MEMRISTOR BASED LOGIC GATE

(71) Applicant: OXFORD BROOKES UNIVERSITY, Oxford (GB)

(72) Inventors: Abusaleh Muhammad Jabir, Oxford (GB); Xiaohan Yang, Oxford (GB); Adedotun Adedeji Adeyemo, Oxford (GB)

(73) Assignee: OXFORD BROOKES UNIVERSITY, Oxford (GB)

( * ) Notice: Subject to any disclaimer, the term of this patent is extended or adjusted under 35 U.S.C. 154(b) by 0 days.

(21) Appl. No.: 16/079,160

(22) PCT Filed: Feb. 20, 2017

(86) PCT No.: PCT/GB2017/050431
§ 371 (c)(1),
(2) Date: Aug. 23, 2018

(87) PCT Pub. No.: WO2017/144862
PCT Pub. Date: Aug. 31, 2017

(65) Prior Publication Data
US 2019/0056915 A1    Feb. 21, 2019

(30) Foreign Application Priority Data

Feb. 23, 2016  (GB) .................................. 1603089.2

(51) Int. Cl.
*G11C 11/00* (2006.01)
*G06F 7/501* (2006.01)
(Continued)

(52) U.S. Cl.
CPC .......... *G06F 7/501* (2013.01); *G11C 13/0007* (2013.01); *H03K 19/017509* (2013.01);
(Continued)

(58) Field of Classification Search
CPC ................. G06F 7/501; G11C 13/0007; H03K 19/017509; H03K 19/173; H03K 19/20; H03K 19/21
(Continued)

(56) References Cited

U.S. PATENT DOCUMENTS 6,028,453 A * 2/2000 Kong ...................... G06F 7/501
326/113
2007/0046506 A1 * 3/2007 Kurd ...................... G06F 7/5318
341/51
(Continued)

FOREIGN PATENT DOCUMENTS

CN  102811051 A   12/2012
JP  H05152936 A   6/1993
(Continued)

OTHER PUBLICATIONS

Japanese Office Action dated Aug. 25, 2020.

*Primary Examiner* — Huan Hoang
(74) *Attorney, Agent, or Firm* — William J. Clemens; Shumaker, Loop & Kendrick, LLP (57) ABSTRACT

A logic gate includes first and second inputs, first through fourth memristors each having a positive terminal and a negative terminal, and first and second outputs. The memristors are connected in a bridge arrangement: the negative terminal of the first memristor and the positive terminal of the second memristor are connected to the first input; the negative terminal of the third memristor and the positive terminal of the fourth memristor are connected to the second input; the negative terminal of the second memristor and the negative terminal of the fourth memristor are connected to the first output; and the positive terminal of the first memristor and the positive terminal of the third memristor are connected to the second output. A voltage of at least one of the outputs, or the voltage difference between the outputs,
(Continued)

corresponds to the result of a logic operation relative to voltages applied to the inputs.

19 Claims, 5 Drawing Sheets

(51) Int. Cl.
    *G11C 13/00*     (2006.01)
    *H03K 19/0175*     (2006.01)
    *H03K 19/173*     (2006.01)
    *H03K 19/20*     (2006.01)
    *H03K 19/21*     (2006.01)

(52) U.S. Cl.
    CPC ........... *H03K 19/173* (2013.01); *H03K 19/20* (2013.01); *H03K 19/21* (2013.01)

(58) Field of Classification Search
    USPC .......................................... 465/148; 365/148
    See application file for complete search history.

(56) References Cited

U.S. PATENT DOCUMENTS

| 2012/0217994 A1* | 8/2012 | Pino ..................... H03K 19/173 |
| | | 326/38 |
| 2014/0028347 A1 | 1/2014 | Robinett et al. |
| 2014/0035620 A1 | 2/2014 | Lin et al. |
| 2015/0019468 A1 | 1/2015 | Lugent et al. |
| 2015/0194802 A1* | 7/2015 | Zhu ..................... H04L 25/0272 |
| | | 361/86 |
| 2015/0256178 A1 | 9/2015 | Kvatinsky et al. |
| 2015/0371705 A1 | 12/2015 | Onkaraiah et al. |
| 2016/0020766 A1 | 1/2016 | Miao et al. |

FOREIGN PATENT DOCUMENTS

| KR | 20140071556 A | 6/2014 |
| WO | 2010068221 A1 | 6/2010 |
| WO | 2014020478 A2 | 6/2014 |

* cited by examiner

MEMRISTOR BASED LOGIC GATE

FIELD OF THE INVENTION

The present invention relates to a logic gate, or to multiple logic gates, in which at least one memristor is used in the logic gate architecture.

BACKGROUND OF THE INVENTION

Memristors (short for 'memory-resistors') are emerging as highly promising nanoscale programmable resistive memory devices, which have already found applications in areas such as very high density nonvolatile memory, physically uncloneable functions (PUFs), neuromorphic systems, and logic design. However, many of the existing memristor based logic architectures are designed to work over multiple clock cycles and require complex control logic for operation. As a result, these are not easy to integrate with existing CMOS technology and require complex control circuitries, which are incompatible with existing architectures. In addition, the capacitance in CMOS can be a limiting factor which sets a poor upper bound on CMOS based systems especially at higher frequencies. There are also the problems of reducing power consumption of logic gate circuits, and improving the chip area utilization.

BRIEF SUMMARY OF THE INVENTION

The present invention has been devised in view of the above problems.

Accordingly, the present invention provides a logic gate comprising:
a first input and a second input;
a first memristor, a second memristor, a third memristor, and a fourth memristor, each memristor having a positive terminal and a negative terminal; and
a first output and a second output,
wherein the negative terminal of the first memristor and the positive terminal of the second memristor are connected in common to the first input,
wherein the negative terminal of the third memristor and the positive terminal of the fourth memristor are connected in common to the second input,
wherein the negative terminal of the second memristor and the negative terminal of the fourth memristor are connected in common to the first output,
wherein the positive terminal of the first memristor and the positive terminal of the third memristor are connected in common to the second output, and
wherein, in use, the voltage of at least one of the outputs, or the voltage difference between the first and second outputs, corresponds to a logic operation relative to voltages applied to the first and second inputs.

BRIEF DESCRIPTION OF THE SEVERAL VIEWS OF THE DRAWING

Embodiments of the invention will now be described, by way of example only, with reference to the accompanying drawings, in which.

DETAILED DESCRIPTION OF THE INVENTION

Figure 1:
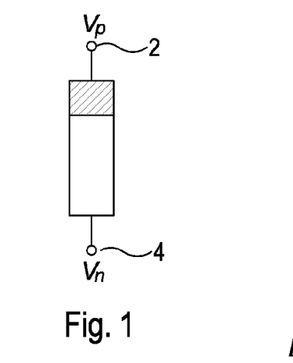
FIG. 1 is a circuit symbol for a memristor.

Memristors are known in the art as devices whose electrical resistance is changed by the electrical current that flows through the device. The resistance has a minimum value $R_{ON}$ and a maximum value $R_{OFF}$. The resistance can be switched and is nonvolatile (the resistance value is 'remembered'), so that a memristor can be used as a memory element. FIG. 1 shows the symbol of a memristor. In the convention used herein, the dark band indicates the 'positive' terminal 2, and the other terminal 4 is the 'negative' terminal. The voltages applied to the positive and negative terminals 2, 4 are $V_p$ and $V_n$ respectively. The memristor switches to low resistance $R_{ON}$ when $V_p - V_n > V_M$, where $V_M$ is a threshold value which is characteristic of the memristor (memristive device); and switches to a high resistance $R_{OFF}$ otherwise. The terms 'positive' and 'negative' used herein are purely labels to distinguish the terminals of the memristor, and to define the switching behavior above; in the art the terminals may also be given other labels such as in/out, active/inactive, input/output, +/−.

Memristors can be made of various materials, such as: $TiO_2$ (for example with doped and undoped regions and with Pt electrodes); $Ag/Ag_5In_5Sb_{60}Te_{30}/Ta$; Ag-a-LSMO-Pt (Ag nano-filaments in amorphous manganite thin films); and other ferroelectric and doped polymeric materials. Embodiments of the present invention are not limited to any specific material, provided the memristive property is present. However, in preferred embodiments, the materials and voltages required are compatible with CMOS electronics.

Figure 2:
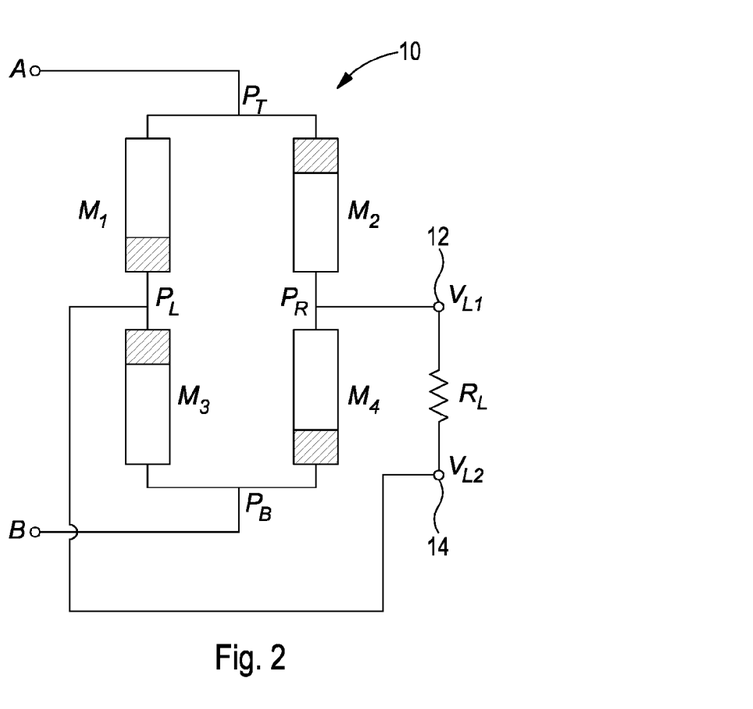
FIG. 2 is a purely memristive logic gate according to an embodiment of the invention with XOR functionality.

A first embodiment of the invention is the purely memristive XOR architecture 10 as shown in FIG. 2. The XOR architecture incorporates four memristors $M_1$, $M_2$, $M_3$ and $M_4$. The negative terminal of the first memristor $M_1$ and the positive terminal of the second memristor $M_2$ are connected in common ($P_T$) to a first input A. The negative terminal of the third memristor $M_3$ and the positive terminal of the fourth memristor $M_4$ are connected in common ($P_B$) to a second input B. The negative terminal of the second memristor $M_2$ and the negative terminal of the fourth memristor $M_4$ are connected in common ($P_R$) to a first output 12. The positive terminal of the first memristor $M_1$ and the positive terminal of the third memristor $M_3$ are connected in common ($P_L$) to a second output 14. The voltages present at the first and second outputs 12, 14 are denoted by $V_{L1}$ and $V_{L2}$, respectively.

As summarized in Table I, the voltage difference between $V_{L1}$ and $V_{L2}$, i.e. the voltage across a hypothetical load resistance $R_L$, behaves like the XOR operation with respect to input voltages applied to inputs A and B, which input voltages are either 0V for the low or OFF logic state, and $+V_1$ for the high or ON logic state. In this table $V_1 > V_M$ and is assumed to be equivalent to $V_{DD}$ in CMOS logic, and represents the ON-state voltage. This is summarized in Lemma 1.

Lemma 1:

The pure memristor circuit in FIG. 2 realizes the XOR functionality depicted in Table I.

TABLE I

| Row | A | B | Output |
|---|---|---|---|
| 1 | 0 | 0 | No current from $V_{L1}$ to $V_{L2}$ ⇒ Logical 0. |
| 2 | 0 | $V_1$ | Current from $V_{L1}$ to $V_{L2}$ ⇒ Logical 1. |
| 3 | $V_1$ | 0 | Current from $V_{L1}$ to $V_{L2}$ ⇒ Logical 1. |
| 4 | $V_1$ | $V_1$ | No current from $V_{L1}$ to $V_{L2}$ ⇒ Logical 0. |

Proof:

We show that the architecture in FIG. 2 satisfies each row in Table I.

Row-1: Follows trivially because no current flows in the circuit.

Row-2: In this case memristors $M_2 = M_3 = R_{OFF}$ because 0V appears at the positive terminal of $M_2$ through A, and $V_1$V appears at the negative terminal of $M_3$ through B. In contrast, memristors $M_4 = M_1 = R_{ON}$ because their positive terminals are closer to $V_1$V and negative terminals closer to 0V. Because of voltage division the voltage at $P_R$ rises towards $V_1$V, and that at $P_L$ falls towards 0V. Hence the current flows from B→$P_B$→$P_R$→*$V_{L1}$→*$V_{L2}$→$P_L$→$P_T$→A. Hence this is logic 1.

Row-3: This is similar to Row-2. Here $M_1 = M_4 = R_{OFF}$, while $M_2 = M_3 = R_{ON}$. Again the voltage at $P_R$ rises towards $V_1$V, and that at $P_L$ falls towards 0V. The current flows from A→$P_T$→$P_R$→$V_{L1}$→$V_{L2}$→$P_L$→$P_B$→B. Hence this is logic 1.

Row-4: In this case both $P_L(V_{L2})$ and $P_R(V_{L1})$ are at the same voltage level and no current flows through $R_L$. Hence this is logic 0.

These operations can take place in the same clock cycle as the inputs. Hence the circuit in FIG. 2 exhibits XOR functionality in Table I in a single cycle. Therefore ∀A, B ∈ {0,V1}, the following are true for the circuit in FIG. 2.

$$V_{L1} = A \vee B \quad (1)$$

$$V_{L2} = A \wedge B \quad (2)$$

$$V_{L1} \geq V_{L2}. \quad (3)$$

Figure 3:
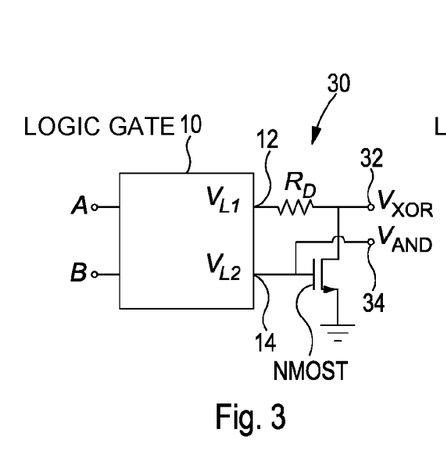
FIG. 3 is a logic gate according to an embodiment of the invention with XOR and AND dual functionality.
Figure 4:
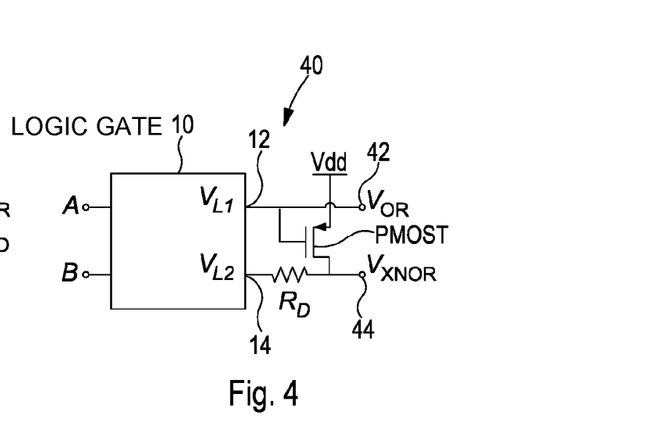
FIG. 4 is a logic gate according to an embodiment of the invention with OR and XNOR dual functionality.

Further embodiments are shown in FIGS. 3 and 4, for realizing the XOR/AND and XNOR/OR operations in a single cycle. These are based on the architecture of the circuit generally denoted 10 in FIG. 2 (excluding any load resistor $R_L$), which is indicated for simplicity by the box 10 in FIGS. 3 and 4, and which has the inputs A and B, and the outputs 12 and 14 (like reference signs are used for like features throughout this description). The new circuits of FIGS. 3 and 4, generally denoted 30 and 40, each include a switching element, in this case the NMOS transistor (NMOST in FIG. 3) and the PMOS transistor (PMOST in FIG. 4), and an optional resistance $R_D$. Thus each circuit consists of one transistor and the four memristors of the circuit 10, so is denoted a '1T-4M' design. The circuit 30 of FIG. 3 has outputs 32 and 34, and the voltages at these outputs are $V_{XOR}$ and $V_{AND}$, respectively, which provide the logic functions XOR and AND with respect to the inputs A, B. The circuit 40 of FIG. 4 has outputs 42 and 44, and the voltages at these outputs are $V_{OR}$ and $V_{XNOR}$, respectively, which provide the logic functions OR and XNOR with respect to the inputs A, B.

These circuits are well suited for seamless integration with the existing CMOS technology without requiring any additional control input/logic, which most existing techniques require. Here the NMOS transistor (NMOST) and the PMOS transistor (PMOST) are assumed to operate in the saturation and cut off regions. The following analysis demonstrates the correctness of operation of these logic gates.

Lemma 2:

The NMOST in FIG. 3 and the PMOST in FIG. 4 realize the following logic operations respectively:

$$V_{XOR} = V_{L1} \wedge \overline{V_{L2}} \quad (4)$$

$$V_{XNOR} = \overline{V_{L1}} \vee V_{L2}. \quad (5)$$

Proof:

The proof follows by firstly noting Eq. (3). The only time $V_{XOR}$ in FIG. 3 is at logic 1 ($\approx V_1$V) is when $V_{L1} \approx V_1$V and $V_{L2} \leq 0$V. At all other times either $V_{XOR} = (V_{L1} = V_{L2} = 0)$ or the NMOST goes into saturation and $V_{XOR} \approx 0.1$V ($V_{L1} = V_{L2} \approx V_1$V). Similarly, in FIG. 4 the only time $V_{XNOR} \approx 0$V is when $V_{L1} \approx V_1$V and $V_{L2} \approx 0$V. At all other times $V_{XNOR} \approx V_1$V. Hence the proof follows.

Theorem 1:

The circuit in FIG. 3 realizes logic XOR ($V_{XOR}$) and AND ($V_{AND}$) operations simultaneously, and the circuit in FIG. 4 realizes the logic XNOR ($V_{XNOR}$) and OR ($V_{OR}$) operations simultaneously.

Proof:

According to Eq. (2) and Eq. (1), the circuits in FIGS. 3 and 4 trivially realize the AND and OR operations respectively. To prove that FIG. 3 realizes the XOR operation, we substitute $V_{L1}$ and $V_{L2}$ from Eq. (1) and Eq. (2) into Eq. (4) respectively. This yields $V_{XOR} = A \oplus B$. Now, regarding FIG. 4, Eq. (5) is merely the inverse of Eq. (4), i.e.: $V_{XNOR} = \overline{V_{XOR}} = 1 \oplus A \oplus B$. Hence the proof follows.

The circuits in FIGS. 2, 3, and 4 realize 'weak' (bufferless) outputs. However, one or more CMOS inverter buffer stages can be added at the outputs for full voltage swings and current drive. For example, a CMOS inverter (comprising two transistors) connected to output 32 ($V_{XOR}$) in FIG. 3 converts it into a 'strong' XNOR gate, while a CMOS inverter connected to output 44 ($V_{XNOR}$) in FIG. 4 converts it into a 'strong' XOR gate. This yields 3T-4M buffered XOR/XNOR gates, which requires considerably fewer transistors compared to some conventional designs.

The Design Rule for the logic gate circuits is now considered. Let $I_{D,sat}$ be the drain saturation current for the NMOST and PMOST. The design rule for the circuit in FIG. 3 will now be described; similar design rule applies to FIG. 4. To ensure that the design works correctly, it needs to be ensured that the transistors operate in the saturation and cutoff regions.

(1) The NMOST is in saturation when $A = B = V_{L1} = V_{L2} \approx V_1$V. In this case $M_2 = M_4 = R_{ON}$, while $M_1 = M_3 = R_{OFF}$. Also as far as $V_{L1}$ is concerned, $M_2 \| M_4 = R_{ON} \| R_{ON}$. Hence, $I_{D,sat} = (V_{DD}-V_{DS,sat})/(R_D+R_{ON}\|R_{ON}) \Rightarrow (R_D+R_{ON}/2) = (V_{DD}-V_{DS,sat})/I_{D,sat}$.

(2) The NMOST is in its cutoff region when $V_{L1} \approx V_1 V$ and $V_{L2} \approx 0V$, i.e. when $A=V_1V$ and $B=0V$ or $A=0V$ and $B=V_1V$. In the first case $M_1=R_{OFF}$ and $M_3=R_{ON}$, and in the second case $M_1=R_{ON}$ and $M_3=R_{OFF}$. In both the cases $M_1$ and $M_3$ form a voltage divider with respect to $V_{L2}$. Hence, it needs to be ensured that $((V_1 \times R_{ON})/(R_{ON}+R_{OFF}))<$the threshold voltage of the NMOST.

Embodiments of the invention have been tested with several memristor models, and the designs work correctly for a range of $R_{ON}$ and $R_{OFF}$. For low $R_{ON}$ a higher value of the resistance $R_D$ maybe necessary, while for higher $R_{ON}$, $R_D$ maybe eliminated altogether. The resistor $R_D$ can be a discrete resistor component, or can be a nanowire, or can be intrinsic resistance in the microcircuitry connection.

Full Adder Embodiment

Figure 5:
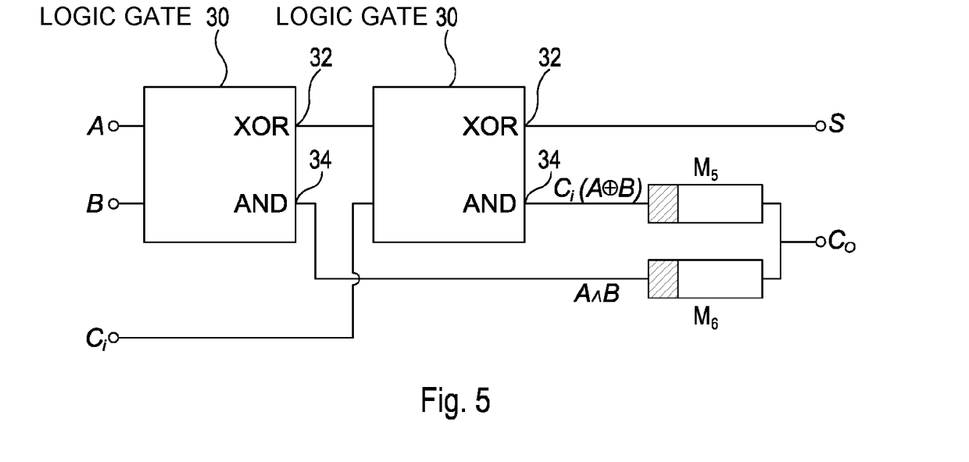
FIG. 5 is a full adder circuit according to an embodiment of the invention.

The multifunctionality of the architecture (i.e. more than one logic operation output in a single gate) offers compact design of more complex circuits. This is demonstrated in a full adder circuit design. FIG. 5 shows an unbuffered (weak) XOR-XOR 2T-10M full adder design. It incorporates two multifunction logic gates 30 each corresponding to the circuit of FIG. 3. The two bits to be added are applied to inputs A and B, and an input carry bit at terminal Ci. The sum bit is presented at output terminal S, and the output carry bit at terminal Co. Here, the sum S=A⊕B⊕Ci. The shared terms are A∧B and Ci(A⊕B), which are ORed together (by the two further memristors $M_5$ and $M_6$) to form the output carry Co=Ci(A⊕B)∨AB.

Figure 6:
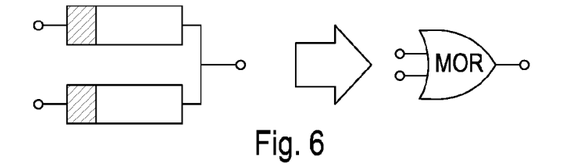
FIG. 6 is a circuit and circuit symbol for a memristive OR gate.
Figure 7:
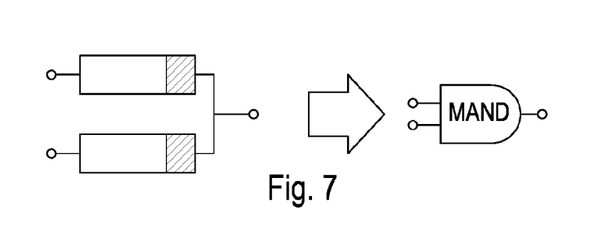
FIG. 7 is a circuit and circuit symbol for a memristive AND gate.
Figure 8:
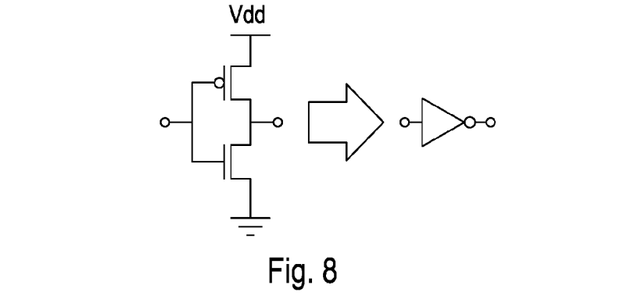
FIG. 8 is a circuit and circuit symbol for an inverter buffer (CMOS NOT gate)

A selection of buffered and unbuffered full adders has been designed. To simplify explanation of these designs, reference is made to FIGS. 6 to 8. FIG. 6 shows two memristors connected to form an OR gate, also called a memristive OR gate or MOR gate, indicated by the corresponding symbol on the right hand side of the figure. FIG. 7 shows two memristors connected to form an AND gate, also called a memristive AND gate or MAND gate, indicated by the corresponding symbol on the right hand side of the figure. FIG. 8 shows two transistors connected to form an inverter (NOT gate), to act as an inverting buffer, indicated by the corresponding symbol on the right hand side of the figure.

Figure 9A:
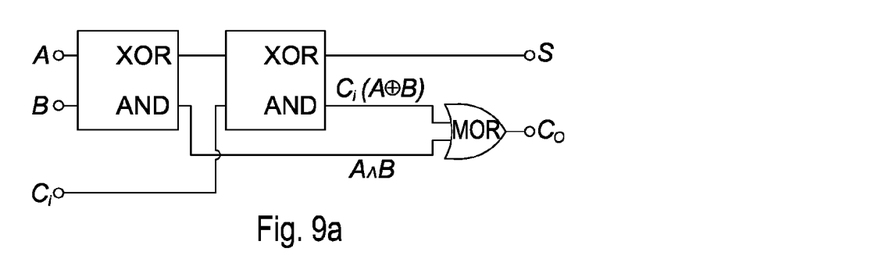
FIGS. 9a-9d are circuit diagrams of unbuffered full adder circuits according to embodiments of the invention.
Figure 9B:
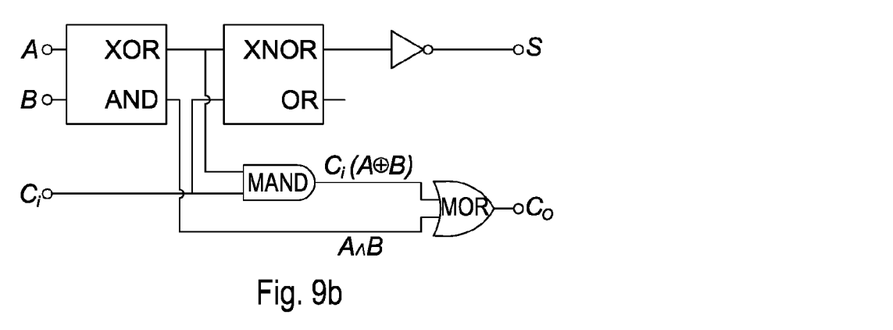
Figure 9C:
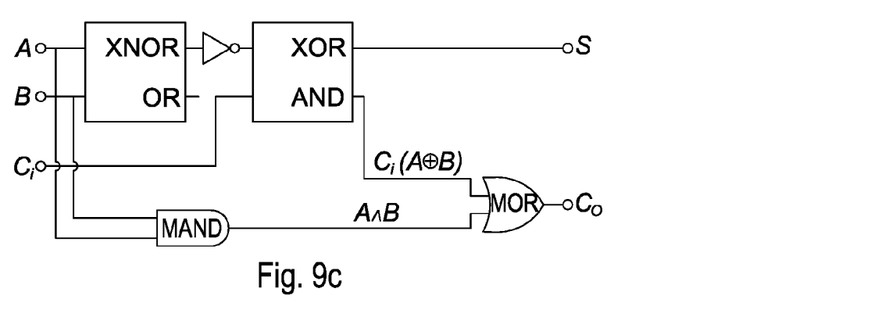
Figure 9D:
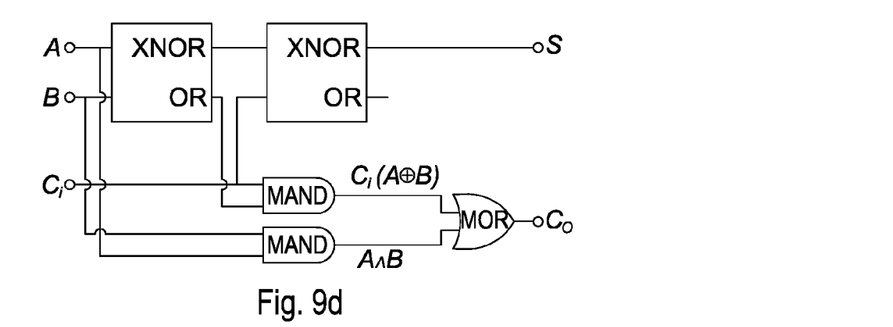
Figure 10A:
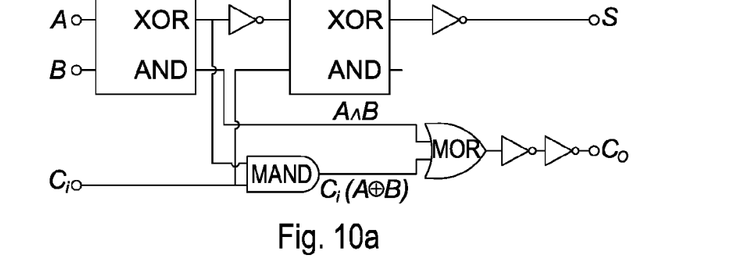
FIGS. 10a-10d are circuit diagrams of buffered full adder circuits according to embodiments of the invention.
Figure 10B:
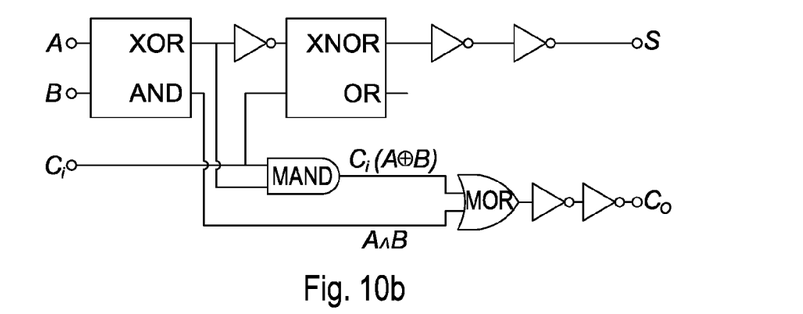
Figure 10C:
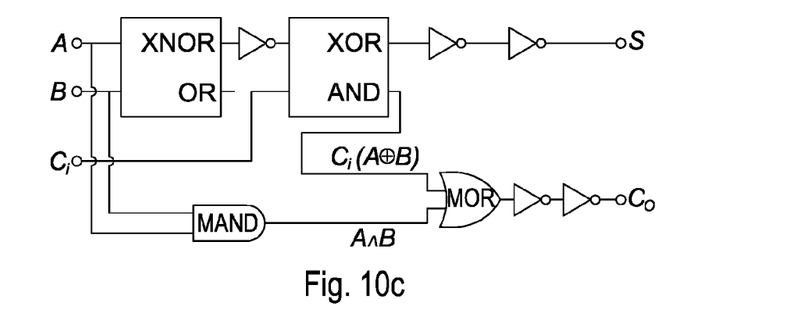
Figure 10D:
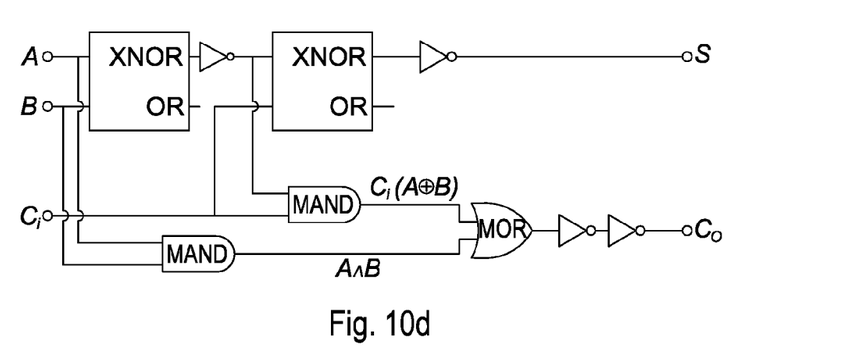

The designs are presented in Table II. The column 'Architecture' shows all possible ways of using the architectures of FIGS. 3 and 4 in the first and second sum stages; and the columns 'Unbuffered' and 'Buffered' summarize the number of transistor and memristor elements used, and total number of elements (components) required, for unbuffered and buffered full adders. The corresponding circuits are illustrated in FIGS. 9a-d for unbuffered and FIGS. 10 a-d for buffered (a-d corresponding with rows 1-4 of the architectures in Table II). In FIGS. 9 and 10, the boxes with outputs labelled XOR and AND are the circuits 30 of FIG. 3, the boxes with outputs labelled OR and XNOR are the circuits 40 of FIG. 4, and the other symbols correspond to the circuits of FIGS. 6 to 8. It will be appreciated that the circuit of FIG. 9a is identical to that of FIG. 5, just with the memristors $M_5$ and $M_6$ replaced by the MOR gate symbol.

TABLE II

| Architecture | Unbuffered | | | Buffered | | |
|---|---|---|---|---|---|---|
| | Shared | Elements | Total | Shared | Elements | Total |
| XOR-XOR | A∧B, C(A⊕B) | 2T-10M | 12 | A∧B, A⊕B | 10T-12M | 22 |
| XOR-XNOR | A∧B, C(A⊕B) | 4T-12M | 16 | A∧B, A⊕B | 12T-12M | 24 |
| XNOR-XOR | C(A⊕B) | 4T-12M | 16 | C(A⊕B) | 12T-12M | 24 |
| XNOR-XNOR | A∨B | 2T-14M | 16 | A∨B/ A⊕B | 10T-14M | 24 |

In Table II, the column 'Buffered' represents the designs with CMOS inverters to achieve full voltage swing at the outputs (circuits shown in FIG. 10). In this column the XOR-XOR design is the most compact (10T-12M) and provides highly reliable performance, and the circuit is illustrated in FIG. 10a. As can be seen, a CMOS inverter is connected to each XOR output; the carry is double inverted. Hence this needs 3T+3T+4T=10T and 8M+2M+2M=12M. This is substantially superior to existing designs, which use e.g. 16T-18M and 27T-2M.

Performance

The memristors were coded in Verilog-A based on the VTEAM model (Kvatinsky, S., Ramadan, M., Friedman, E. G., Kolodny, A.: 'VTEAM: A General Model for Voltage-Controlled Memristors', *IEEE Trans. Circuits Syst. II: Express briefs*, 2015, 62, (8), PP. 786-790) and the circuits were designed and simulated in Cadence Virtuoso (trade mark). The 32 nm technology node was used for the experiments with $V1=V_{DD}=1.2V$, and $I_{D,sat} \approx 46.63$ μA for the NMOST and $I_{D,sat} \approx 47.6$ μA for the PMOST at 27 C operating temperature. As an example of $R_{ON}$ and $R_{OFF}$ selection, if one sets $R_{ON}=500Ω$ and $R_{OFF}=2KΩ$, then based on Design Rule-(1) $R_D \approx 24KΩ$. Also this ensures about 0.24V drop across $R_{ON}$ to satisfy Design Rule-(2). A higher $R_{OFF}$, e.g. $R_{OFF}=80KΩ$, ensures better power performance.

The performance of 3T-4M embodiments of the invention has been compared with CMOS based designs from Mishra et al. (Mishra, S. S., Agrawal, A. K., Nagaria, R. K.: 'A comparative performance analysis of various CMOS design techniques for XOR and XNOR circuits', *International Journal on Emerging Technologies*, 2010, 1, (1), pp. 1-10). The first two rows of Table III present the performance of 3T-4M XOR and XNOR gates (corresponding to FIGS. 4 and 3, respectively, with an additional 2T inverter buffer of FIG. 8 on the XNOR or XOR output), while the last two rows present the performance of the 10T/8T CMOS XOR/XNOR gates of Mishra et al. The latter design is based on a 'weak' 6T XOR gate. The load capacitance was considered to be 1 Femto Farad (fF). The power, in microwatts (μW), is the average of the total static and dynamic powers. Clearly, both designs according to embodiments of the invention require significantly less power than the CMOS designs, while maintaining consistent performance even at 8 GHz. In fact the CMOS designs failed around 4 GHz frequencies (the 'Stat' or status column indicating correct operation: pass or fail). In addition, it is noted that the buffered XNOR design embodiment is considerably more power efficient than the buffered XOR design embodiment. This is owing to the use of the NMOST vs PMOST and the way they are connected as shown in FIGS. 3 and 4.

TABLE III

| | Frequency | | | | | |
|---|---|---|---|---|---|---|
| | 2 GHz | | 4 GHz | | 8 GHz | |
| Architecture | Power (μW) | Stat | Power (μW) | Stat | Power (μW) | Stat |
| 3T-4M XOR | 13.47 | Pass | 17.85 | Pass | 24.86 | Pass |
| 3T-4M XNOR | 4.67 | Pass | 8.85 | Pass | 16.20 | Pass |
| 10T C-XOR | 67.93 | Pass | 72.01 | Fail | 78.61 | Fail |
| 8T C-XNOR | 54.55 | Pass | 56.50 | Fail | 59.78 | Fail |

Figure 11:
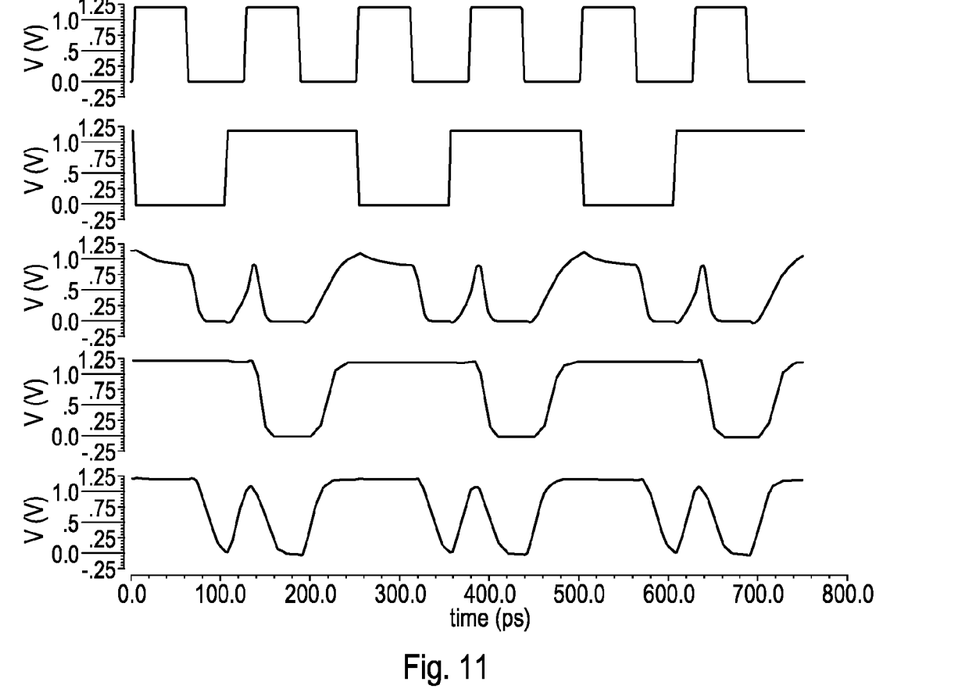
FIG. 11 shows graphs of gate inputs and XOR outputs for both comparative example gates and a gate according to an embodiment of the present invention.

FIG. 11 presents the performance of the above 3T-4M buffered XOR gate embodiment at 8 GHz in comparison with known designs. The top two signals are the input voltages applied to terminals A and B; the third graph is the output of the 10T CMOS XOR gate of Mishra et al.; the fourth graph is the output of the 6T-2M hybrid memristor-CMOS based XOR designs from Mathew et al. (Mathew, J., Chakraborty, R. S., Sahoo, D. P., Yang, Y., Pradhan, D. K.: 'A novel memristor based physically uncloneable function', ELSEVIER, INTEGRATION, the VLSI journal, 2015 51, pp. 37-45); and the bottom graph is the output of the 3T-4M buffered XOR gate embodiment. Both the comparative example 10T CMOS and 6T-2M XOR gates failed as can be seen by the incorrect logic operation and/or incomplete voltage swings.

The buffered full adder designs in Table II have also been tested at various frequencies. The 10T-12M design from the first row (XOR-XOR architecture) operated correctly at 8 GHz and required 63.53 μW power. This is lower than the power consumed by a single CMOS XOR gate (Table III).

Further Variants

Referring to FIG. 2, it will be seen that memristors $M_2$ and $M_4$ form an OR gate with respect to the inputs A, B; the OR result voltage $V_{L1}$ appearing at output 12 (c.f. 'MOR' gate FIG. 6). It will also be seen that memristors $M_1$ and $M_3$ form an AND gate with respect to the inputs A, B; the AND result voltage $V_{L2}$ appearing at output 14 (c.f. 'MAND' gate FIG. 7). The pure memristive architecture of FIG. 2 behaves like an XOR gate (Table I). Here, $V_{L1}>=V_{L2}$ for the NMOS and PMOS transistors to work properly and provide the XOR and XNOR gate functionality (FIGS. 3 and 4 respectively).

Figure 12:
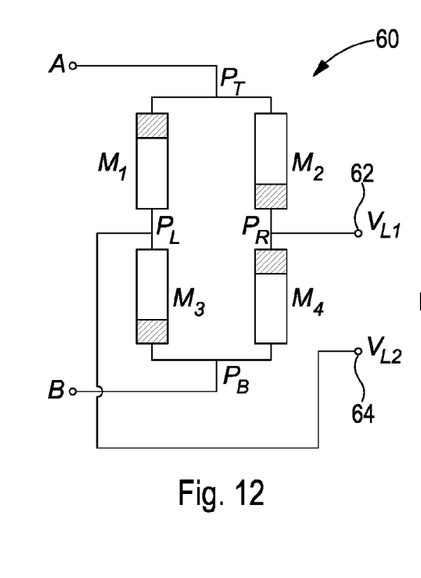
FIG. 12 is a purely memristive logic gate according to a further embodiment of the invention with XNOR functionality.
Figure 13:
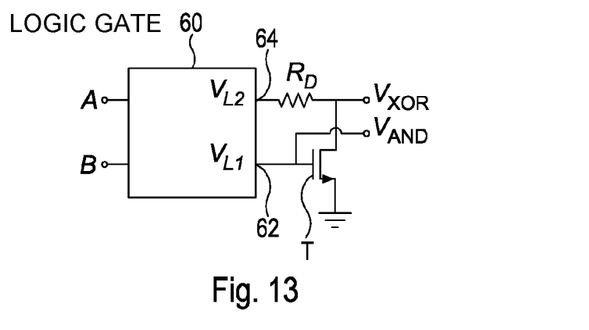
FIG. 13 is a logic gate according to a further embodiment of the invention with XOR and AND dual functionality.
Figure 14:
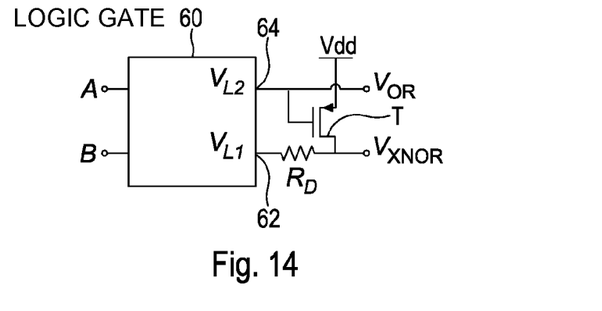
FIG. 14 is a logic gate according to a further embodiment of the invention with OR and XNOR dual functionality.

It is also possible to reverse the memristor polarities as shown in the circuit 60 in FIG. 12. Now voltage $V_{L1}$ at output 62 is the AND operation on the inputs A, B, and the voltage $V_{L2}$ at output 64 is the OR operation, i.e. the AND and OR gates are swapped compared to FIG. 2. In this case the circuit behaves like a pure memristive XNOR functionality. However, in this case it is necessary to ensure that $V_{L2}>=V_{L1}$ for the transistors T to work and provide the XOR and XNOR functionality, see the circuits of FIGS. 13 and 14, respectively. Note that the roles of $V_{L1}$ and $V_{L2}$ have reversed in FIGS. 13 and 14 compared to FIGS. 3 and 4 (c.f. terminals 12, 14 and terminals 64, 62). It will be appreciated that with these changes, the circuit of FIG. 13 is identical to the circuit of FIG. 3, and the circuit of FIG. 14 is identical to the circuit of FIG. 4.

A high performance multifunction logic architecture has been presented, which can be seamlessly integrated with the existing CMOS technology. One embodiment is a design comprising one transistor and four memristors (1T-4M) that requires considerably fewer transistors and memristors compared to existing techniques. The designs embodying the invention are capable of significantly outperforming existing CMOS as well as hybrid CMOS-memristor designs in terms of chip area, power consumption, and reliable performance, especially at high frequencies.

In particular, the 1T-4M design realizes multiple functions (XOR/AND or XNOR/OR) in a single cycle, i.e. during the same cycle the input is applied, and can be seamlessly integrated with the existing CMOS technology with the least overhead compared to any existing technique. One advantage of memristors is that it is possible to fabricate memristors in 3D whereas with CMOS only 2D fabrication is possible. This allows memristors to be fabricated along the Z-axis, layered over the X-Y axis of CMOS layout. In addition, the capacitance in CMOS can be a limiting factor which sets a rather poor upper bound on CMOS based systems especially at higher frequencies. These short comings of CMOS based designs are addressed by reducing the number of CMOS transistors in embodiments of the invention. This not only significantly improves the reliability of embodiments at high frequencies, it also enables very low power consumptions and much better chip area utilization. The latter is possible because space is freed up in the CMOS layer, where more CMOS functionality can be incorporated by units which solely depend on the CMOS technology. The proposed embodiments also enable reduced memristor count.

Additionally, the multifunctionality feature of the architecture embodying the invention allows highly compact and efficient design of systems, as demonstrated by the highly optimized, low complexity, full adder circuits defined herein.

The invention claimed is:

1. A logic gate comprising:
a first input and a second input each adapted to have applied thereto different voltages representing logic states;
a first memristor, a second memristor, a third memristor, and a fourth memristor, each of the memristors having a positive terminal and a negative terminal;
a first output and a second output; and
a transistor, wherein a gate of the transistor is connected to one of the first and second outputs, wherein a drain of the transistor is connected to another of the first and second outputs, and wherein a source of the transistor is connected to a positive or negative supply voltage or ground,
wherein the negative terminal of the first memristor and the positive terminal of the second memristor are connected in common to the first input,
wherein the negative terminal of the third memristor and the positive terminal of the fourth memristor are connected in common to the second input,
wherein the negative terminal of the second memristor and the negative terminal of the fourth memristor are connected in common to the first output,
wherein the positive terminal of the first memristor and the positive terminal of the third memristor are connected in common to the second output, and
wherein, in use, a voltage of at least one of the outputs, or a voltage difference between the first and second outputs, corresponds to a result of a logic operation relative to the logic state voltages applied to the first and second inputs.

2. The logic gate according to claim 1, wherein the voltage difference between the outputs corresponds to the result of a logic operation relative to the voltages applied to the first and second inputs, and wherein the logic operation is one of XOR and XNOR.

3. The logic gate according to claim 1, wherein said transistor is NMOS or PMOS.

4. The logic gate according to claim 1, wherein the common connection of two of the memristor terminals of the same polarity is connected via a resistance to the respective output.

5. The logic gate according to claim 1, wherein the voltage at the first output represents a different logic operation from the voltage at the second output, with respect to the inputs.

6. The logic gate according to claim 5, wherein the two different logic operations are XOR and AND, or are OR and XNOR.

7. The logic gate according to claim 1, further comprising at least one inverter having an input connected to one of said first and second outputs to provide a buffered output at an output of the inverter.

8. The logic gate according to claim 7, wherein said inverter is a CMOS inverter buffer.

9. A full adder circuit comprising two logic gates each according to claim 1.

10. The full adder circuit according to claim 9, further comprising at least two further memristors configured to provide at least one of an OR gate and an AND gate.

11. A full adder circuit having two logic gates comprising:
each of the logic gates including,
a first input and a second input,
a first memristor, a second memristor, a third memristor, and a fourth memristor, each of the memristors having a positive terminal and a negative terminal, and
a first output and a second output,
wherein the negative terminal of the first memristor and the positive terminal of the second memristor are connected in common to the first input,
wherein the negative terminal of the third memristor and the positive terminal of the fourth memristor are connected in common to the second input,
wherein the negative terminal of the second memristor and the negative terminal of the fourth memristor are connected in common to the first output,
wherein the positive terminal of the first memristor and the positive terminal of the third memristor are connected in common to the second output, and
wherein, in use, a voltage of at least one of the outputs, or a voltage difference between the first and second outputs, corresponds to a result of a logic operation relative to voltages applied to the first and second inputs; and
at least two further memristors configured to provide at least one of an OR gate and an AND gate.

12. A logic gate comprising:
a first input and a second input each adapted to have applied thereto different voltages representing logic states;
a first memristor, a second memristor, a third memristor, and a fourth memristor, each of the memristors having a positive terminal and a negative terminal;
a first output and a second output; and
a transistor, wherein a gate of the transistor is connected to one of the first and second outputs, wherein a drain of the transistor is connected to another of the first and second outputs, and wherein a source of the transistor is connected to a positive or negative supply voltage or ground,
wherein the negative terminal of the first memristor and the positive terminal of the second memristor are connected in common to the first input,
wherein the negative terminal of the third memristor and the positive terminal of the fourth memristor are connected in common to the second input,
wherein the negative terminal of the second memristor and the negative terminal of the fourth memristor are connected in common to the first output,
wherein the positive terminal of the first memristor and the positive terminal of the third memristor are connected in common to the second output, and
wherein, in use, a voltage at the first output corresponds to a result of a first logic operation relative to voltages applied to the first and second inputs, and a voltage at the second output corresponds to a result of a second logic operation relative to the voltages applied to the first and second inputs, and wherein the first logic operation is different from the second logic operation.

13. The logic gate according to claim 12, wherein said transistor is NMOS or PMOS.

14. The logic gate according to claim 12, wherein the common connection of two of the memristor terminals of the same polarity is connected via a resistance to the respective output.

15. The logic gate according to claim 12, wherein the two different logic operations are XOR and AND, or are OR and XNOR.

16. The logic gate according to claim 12, further comprising at least one inverter having an input connected to one of said first and second outputs to provide a buffered output at an output of the at least one inverter.

17. The logic gate according to claim 16, wherein the at least one inverter is a CMOS inverter buffer.

18. A full adder circuit comprising two logic gates each according to claim 12.

19. The full adder circuit according to claim 18, further comprising at least two further memristors configured to provide at least one of an OR gate and an AND gate.

* * * * *